(12) United States Patent
Castaneda et al.

(10) Patent No.: US 6,380,877 B2
(45) Date of Patent: *Apr. 30, 2002

(54) METHOD AND APPARATUS FOR DIGITAL TO ANALOG CONVERTERS WITH IMPROVED SWITCHED R-2R LADDERS

(75) Inventors: David Castaneda, Sunnyvale; Gary G. Fang, San Jose; Chowdhury F. Rahim, Saratoga, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/840,661

(22) Filed: Apr. 23, 2001

Related U.S. Application Data

(63) Continuation of application No. 09/299,691, filed on Apr. 26, 1999, now Pat. No. 6,222,473.

(51) Int. Cl.[7] .................................................. H03M 1/78
(52) U.S. Cl. ........................................ 341/154; 341/144
(58) Field of Search ................................ 341/154, 144

(56) References Cited

U.S. PATENT DOCUMENTS 4,580,131 A    4/1986   Seiler 6,222,473 B1 * 4/2001 Castaneda et al. .......... 341/154

FOREIGN PATENT DOCUMENTS

FR    2 621 434         4/1989
GB    2 206 009 A      12/1988

OTHER PUBLICATIONS

Richard C. Dorf, The Electrical Engineering Handbook, 1993, pp. 771–775, 781–782, CRC Press, Inc., Boca Raton.

* cited by examiner

Primary Examiner—Peguy JeanPierre
Assistant Examiner—Jean Bruner Jeanglaude
(74) Attorney, Agent, or Firm—Blakely, Sokoloff, Taylor & Zafman LLP

(57) ABSTRACT

Operating range of R–2R ladders for digital to analog converters (DACs) is improved by increasing resistance in series with a termination switch in a termination leg to avoid transistor saturation for increasing DAC resolution, increasing reference voltage range, or other application. The switched R–2R ladder circuit is modified to compensate for increasing resistance to maintain proper resistor matching for generation of the appropriate range of analog output voltages for a digital input signal.

17 Claims, 7 Drawing Sheets

METHOD AND APPARATUS FOR DIGITAL TO ANALOG CONVERTERS WITH IMPROVED SWITCHED R-2R LADDERS

CROSS REFERENCE TO RELATED APPLICATION

This application claims the benefit of and is a continuation of U.S. patent application Ser. No. 09/299,691, filed Apr. 26, 1999, now issued as U.S. Pat. No. 6,222,473.

FIELD OF THE INVENTION

This invention relates generally to digital to analog converters. More particularly, the invention relates to switched R–2R ladder networks.

BACKGROUND OF THE INVENTION

The functional operation of a digital to analog converter (DAC) is well known. Generally, a DAC accepts an digital input signal and converts it into an analog output signal. The digital input signal has a range of digital codes which are converted into a continuous range of analog signal levels of the analog output signal. DACs are useful to interface digital systems to analog systems. Applications of DACs include video or graphic display drivers, audio systems, digital signal processing, function generators, digital attenuators, precision instruments and data acquisition systems including automated test equipment.

There are a variety of DACs available for converting digital input signals into analog output signals depending upon the desired conversion functionality. The variations in the DACs available may have different predetermined resolutions of a digital input signal, receive different encoded digital input signals, have different ranges of analog output signals using a fixed reference or a multiplied reference, and provide different types of analog output signals. Additionally there are a number of DAC performance factors to consider such as settling time, full scale transition time, accuracy or linearity, and a factor previously mentioned, resolution.

The digital input signal is a number of bits wide that defines the resolution, the number of output levels or quantization levels and the total number of digital codes that are acceptable. If the digital input signal is m-bits wide, there are $2^m$ output levels and $2^{m-1}$ steps between levels. The digital input signals may be encoded in straight binary, two's complement, offset binary, grey scale code, binary coded decimal or other digital coding. The range of analog output signal values usually depend upon an analog reference. The analog reference may be internally generated but is usually externally provided for precision. The analog output signal range may be proportional to the digital input signal over a fixed analog reference level as in a fixed reference DAC. Alternatively, the analog output signal may be the product of a varying input analog reference level and the digital code of the digital input signal as in multiplying DACs. The analog output signal may be unipolar ranging in either positive values or negative values or it may be bipolar ranging between both positive and negative output values. The analog output signal may be an analog voltage signal or an analog current signal.

Additionally, the type of electronic circuitry used to form a DAC varies as well. Bipolar junction transistor (BJT) technology, metal oxide semiconductor (MOS) technology or a combination thereof are used to construct DACs. BJT technology may be PNP technology with PNP transistors or NPN with NPN transistors or both, while MOS technology may be PMOS with P-channel field effect transistors (PFET), NMOS with N-channel field effect transistors (PFET) or CMOS technology having both PFETs and NFETs.

Referring now to FIG. 1A, a block diagram of a DAC 100 has a digital input signal DIN 101, a positive analog supply voltage level AVref+ 104, and a negative analog supply voltage level AVref– 105 in order to generate an analog voltage output signal AVout 110. Alternatively DAC 100 can generate an analog current output signal with minor changes to its circuit configuration. For simplicity in discussion consider DAC 100 to be a fixed reference DAC such that the output voltage range of AVout 110 is a function of DIN 101 and the range of voltage is defined by the predetermined voltage levels of AVref+ 104 and AVref– 105. DIN 101 is m bits wide. The predetermined value of m represents the range of decimal numbers that DIN 101 will represent. The selected circuitry for DAC 100 varies depending upon a number of factors including power supply inputs and desired parameters of input and output signals. As illustrated in FIG. 1A, DAC 100 includes a signal converter 112 and an amplifier or buffer 114. Some forms of DACs, specifically current output DACs, may not include the buffer 114 and require external amplification. Signal converter 112 converts DIN 101 into a form of analog signal, VLADR 102, which is input to buffer 114. Buffer 114 buffers the analog signal VLADR 102 generated by the signal converter 112 from a load that may be coupled to AVout 110. The signal converter 112 includes a switched R–2R ladder 116 and a switch controller 118. Switch controller 118 controls switches within the switched R–2R ladder 116 to cause it to convert the value of DIN 101 into an analog signal.

As previously discussed, there are a number of DAC performance factors to consider including a DAC's accuracy or linearity. Referring now to FIGS. 1B and 1C, graphs of bipolar output voltages for AVout 110 and unipolar output voltages for AVout 110 as a function of the digital input signal DIN 101 are illustrated. Transfer curves 120–121 represent the ideal transfer characteristics of a DAC for converting DIN into AVout. Transfer curves 122–123 represent the actual measured transfer characteristics of a DAC for converting DIN into AVout. The difference between the ideal transfer curves 120–121 and the actual transfer curves 122–123 is the integral linearity of a DAC. If a change in an analog voltage reference level is required to establish a zero point or a midpoint of the conversion range it is referred to as an offset voltage. Differential linearity is the linearity between code transitions measuring the monotonicity of a DAC. If increasing code values of DIN results in increasing values of AVout, the DAC is monotonic, and if not, the DAC has a conversion error and is not monotonic. The linearity of a DAC is very important for accurate conversions and is usually specified in units of least significant bits (LSB) of the m-bits of DIN. Linearity of a DAC can vary over temperature, voltages, and from circuit to circuit. Additionally, DAC linearity becomes more important as the predetermined DAC resolution is increased where the value of m is larger and additional digital codes are desired to be converted. Furthermore, as the analog voltage reference level range between AVref+ 104 and AVref– 105 may be increased to accommodate additional resolution, it is desirable to maintain linearity in a DAC.

Referring now to FIG. 2A, a prior art switched R–2R ladder 116 is illustrated. The switched R–2R ladder 116 is a 4 bit inverted R–2R ladder to provide an analog voltage output signal but may be easily expanded to m-bits with the addition of other intermediate R–2R switch legs and additional switch control lines. Alternatively, a non-inverted R–2R ladder could be used to provide an analog current output signal. Signals DBn/DBp 201 are selectively controlled by the switch controller 118 in order to generate an analog voltage output signal VLADR 102. DBn/DBp 201 switches ON and OFF NFETs 211–214 and PFETs 216–219 in order to change the voltage division of the R–2R resistor network between AVref+ 104 and AVref– 105 and VLADR 102. Inverters 246–249 generate the inverter polarity of the switch control lines D4Bp-D1Bp 241–244 to control the NFETs 236–239 to form fully complementary switches with PFETs 216–219. NFET 211 and PFET 216/NFET 236 represent the MSB of the DAC and can couple $8/16$ of the reference voltage range to VLADR 102. NFET 212 and PFET 217/NFET 237 can couple $4/16$ of the reference voltage range to VLADR 102. NFET 213 and PFET 218/NFET 238 can couple $2/16$ of the reference voltage range to VLADR 102. NFET 214 and PFET 219/NFET 239 represent the LSB of the DAC and can couple $1/16$ of the reference voltage range to VLADR 102. Thus, when the digital code is 1111, PFETs 216–219 and NFETs 236–239 are all ON and NFETs 211–214 are all OFF such that $15/16$ of the reference voltage range is coupled to VLADR 102. When the digital code is 0000, NFETs 211–214 are all ON and PFETs 216–219 and NFETs 236–239 are all OFF such that no current flows between AVref+ 104 and AVref– 105 in a resistor and AVref– 105 is coupled to VLADR 102.

The circuit connections of the switched R–2R ladder 116 are now described. NFET 215 has its gate tied to terminal leg gate voltage signal, TLGV 235, such that it is constantly turned ON. The voltage level of TLGV 235 additionally provides switch resistance matching between NFETs and PFETs in the switched R–2R ladder 116. NFETs 211–215 have sources connected to AVref– 105 and drains respectively connected to first ends of resistors 220–224. PFETs 216–219 have sources connected to AVref+ 104 and drains respectively connected to first ends of resistors 220–223. NFETs 236–239 have sources respectively connected to the first ends of resistors 220–223 and drains connected to AVref+ 104. The gates of NFETs 211–214 are respectively connected to signals D4Bn-D1Bn 231–234 and gates of PFETs 216–219 are respectively connected to signals D4Bp-D1Bp 241–244 of DBn/DBp 201. The inverters 246–249 have inputs respectively coupled to signals D4Bp-D1Bp 241–244 to generate the inverted polarity for coupling their outputs to the gates of NFETs 236–239 respectively. Signals D4Bn-D1Bn 231–234 and signals D4Bp-D1Bp 241–244 are collectively referred to as signals DBn/DBp 201 from switch controller 118. Resistors 220–223 each have a resistance value of 2R. Resistors 224–228 each having a resistance value of R are coupled in series together with a first end of resistor 228 coupled to VLADR 102. A second end of resistor 224 is coupled to a second end of resistor 225 at node 250 while a second end of resistor 220 is coupled to VLADR 102. Resistors 223, 225, and 226 each have an end coupled to node 251. Resistors 222, 226, and 227 each have an end coupled to node 252. Resistors 221, 227, and 228 each have an end coupled to node 253. The MSB leg of the switched R–2R ladder 116 is defined as NFET 211/PFET 216/NFET 236 and resistor 220, the LSB leg as NFET 214/PFET 219/NFET 239 and resistors 223 and 226, and the termination leg as NFET 215 and resistors 224–225. The intermediate legs of the switched R–2R ladder 116 are NFET 213/PFET 218/NFET 238 and resistors 222 and 227 and NFET 212/PFET 217/NFET 237 and resistors 221 and 228.

As previously discussed, linearity of DAC 100 is important to accurately convert DIN 101 to AVout 110. In switching voltages in the switched R–2R ladder 116, PFETs 216–219, NFETs 236–239 and NFETs 211–214 are switched ON to operate in their linear region where drain to source voltage is equivalent to drain to source current times the ON resistance of the transistor. VDS≈IDS×RON. The drain to source voltage and drain to source current vary such that the ON resistance RON of the transistor may remain somewhat constant. FIG. 2B illustrates idealized output characteristic of an NFET. The y-axis represents drain to source current IDS and the x-axis represents drain to source voltage VDS. The curves 260–263 are generated respectively by applying increasing levels of gate to source voltage VGS to the NFET. The PFETs 216–219, NFETs 236–239 and NFETs 211–214 preferably operate in the linear or triode region 264 before going into saturation which is represented by saturation curve 265. The saturation curve 265 represents the saturation voltage from drain to source where VDSsat≈VGS–VT where VT is the threshold voltage for a given MOSFET device. In the linear region a rough estimate of current is provided by the equation IDS=K'(W/L)[VGS–VT–(VDS/2)]VDS where K' is a device constant. In saturation this current equation can be reduced to IDSsat=(½)K'(W/L)[VGS–VT]$^2$ when VDS=VDSsat≈VGS–VT. Thus, IDSsat is relatively constant over variations in VDS once saturation occurs such that the resistance of the transistor remains high and relatively constant up until a drain to source breakdown voltage is reached. Reference designators 266–269 illustrate breakdown of a MOSFET such that for little change in drain to source voltage the drain to source current increases substantially. In breakdown, the device resistance is very small and substantial damage may occur if the drain to source current is not limited.

Additionally, PFETs and NFETs are binarilly weighted from LSB to MSB to adjust for differences in IDS drain to source current flow and maintain similar VDS voltage drops across drain to source. For example, if NFET 214/PFET 219/NFET 239 switches are weighted 1×, NFET 213/PFET 218/NFET 238 switches are weighted 2×, NFET 212/PFET 217/NFET 237 switches are weighted 8×, and NFET 211/PFET 216/NFET 236 switches are weighted 16× in transistor size to reduce the RON of the transistors. This reduces user trimming for a drift that would otherwise be introduced by mismatched RON resistances when the transistor switches are turned ON and OFF.

NFET 215 is provided in the termination leg and is weighted 1× to match RON of the other switches in the other legs of the switched R–2R ladder 116 and to match device temperature coefficients as well. Preferably, NFET 215 operates in its linear region 264 as well. However, there are circumstances that may cause NFET 215 to go into saturation and no longer operate in its linear region such that it limits the drain to source current flow to a relatively constant value and cause DAC output errors. When DIN 101 is such that PFET 219/NFET 239 are ON and NFET 214 is OFF, the LSB series circuit of PFET 219/NFET 239, resistors 223–225 and NFET 215 is completed. This causes an incrementally larger amount of drain to source current to flow through NFET 215 because of the relatively lower resistance between AVref+ 104 and AVref– 105. Furthermore, under this condition a higher voltage must be dropped across the drain and source of NFET 215 such that it can cause NFET 215 to incrementally increase towards the saturation region causing linear degradation of the DAC 100. Additionally, if DIN 101 is set to full scale, such as 1111, additional drain to source current is required to flow through NFET 215. These conditions are exacerbated when the reference voltage range, (AVref+ 104)–(AVref– 105), is greater than the VDSAT of NFET 215; or the VDSAT of NFET 215 is less than the reference voltage range because of the manufacturing process or other operating voltages; or a higher resolution of DAC is desirable thereby generating additional drain to source current flow and drain to source voltage drop across NFET 215 such that non-linearity in a DAC can occur. If the voltage across NFET 215 is even greater, the transistor can go into breakdown causing transistor inoperability and possibly permanent circuit damage. In order to design higher resolution DACs, accommodate wider ranges of reference voltages and maintain DAC linearity, it is desirable to improve the switched R–2R ladder 116 such that these conditions are reduced and NFET 215 operates in its linear region over a wider range of operating conditions.

BRIEF SUMMARY OF THE INVENTION

Briefly, the present invention includes a method, apparatus and system for digital to analog converters with improved switched R–2R ladders as described in the claims. Switched R–2R ladders are improved by increasing the resistance in series with the termination switch in the termination leg. The switched R–2R ladder circuit is modified to compensate for increasing resistance in the termination leg in order to maintain proper resistor matching for generation of the appropriate range of analog output voltages for a digital input signal. The increased resistance in the termination leg causes a larger voltage to be dropped across it thereby reducing the voltage dropped across the termination switch and thus preserving its linear operation.

BRIEF DESCRIPTIONS OF THE DRAWINGS

DETAILED DESCRIPTION OF THE PREFERRED EMBODIMENT

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail so as not to unnecessarily obscure aspects of the present invention.

The present invention includes a method, apparatus and system for digital to analog converters having improved switched R–2R ladders. Briefly, switched R–2R ladders are improved by increasing the resistance in series with the termination switch in the termination leg. The switched R–2R ladder circuit is modified to compensate for increasing resistance in the termination leg in order to maintain proper resistor matching for generation of the appropriate range of analog output voltages for a digital input signal. The increased resistance in the termination leg causes a larger voltage to be dropped across it thereby reducing the voltage dropped across the termination switch and thus preserving its linear operation.

Figure 1A:
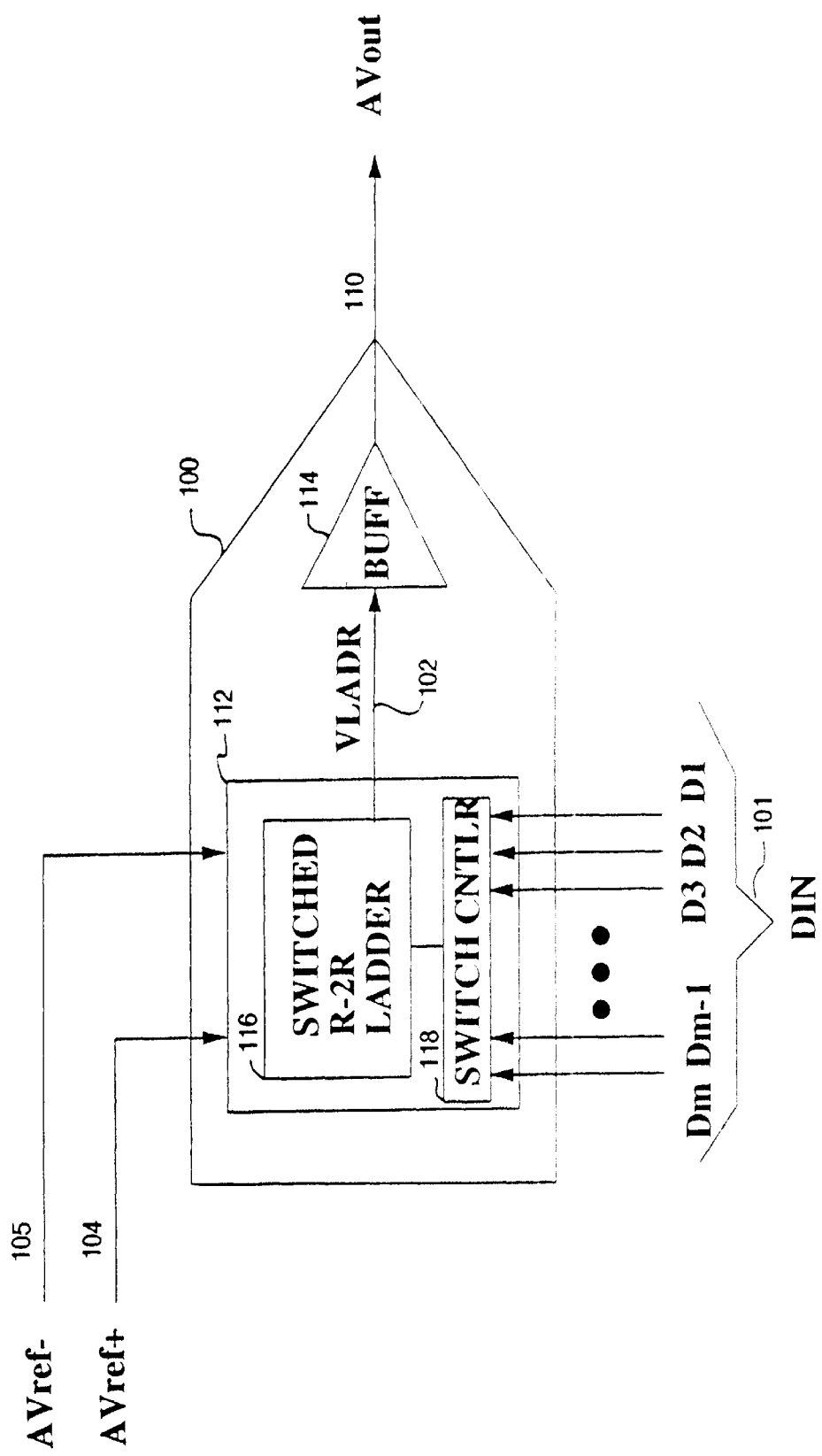
FIG. 1A is a block diagram of a prior art digital to analog converter.
Figure 1C:
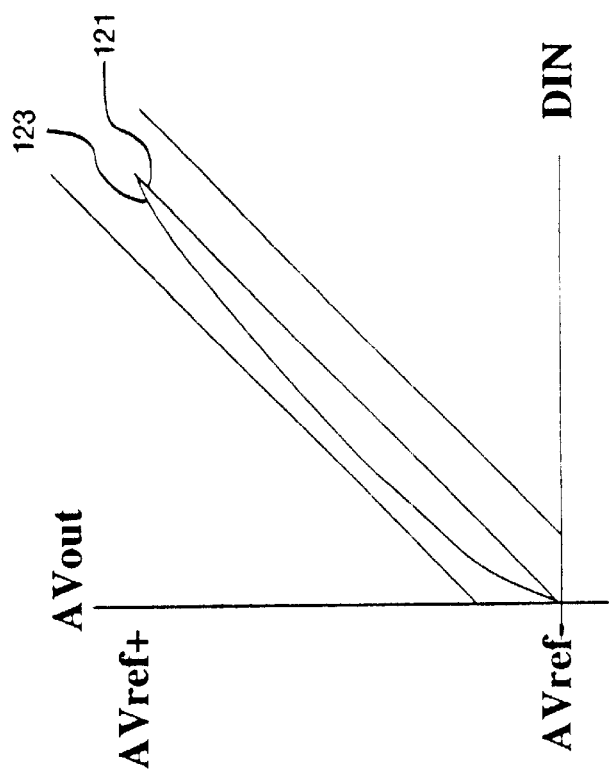
FIG. 1C is a graph of a prior art transfer function of digital to analog converter having a positive unipolar analog output.
Figure 1B:
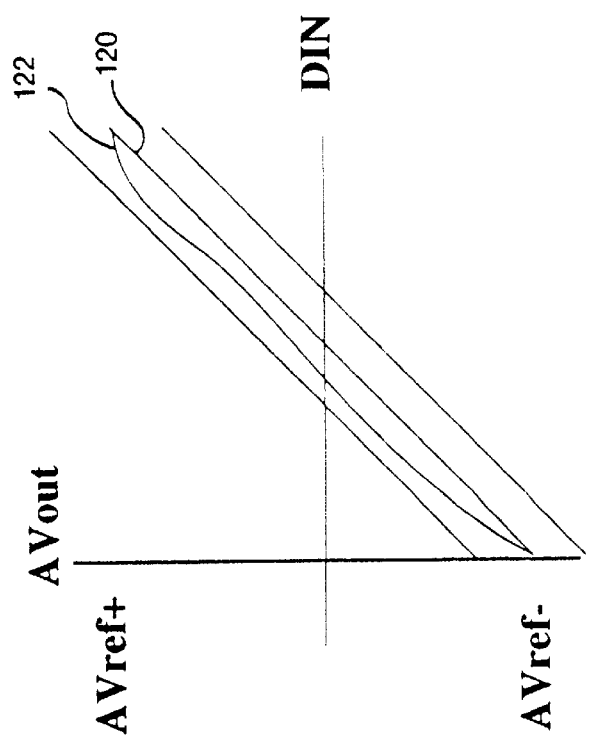
FIG. 1B is a graph of a prior art transfer function of digital to analog converter having a bipolar analog output.
Figure 2A:
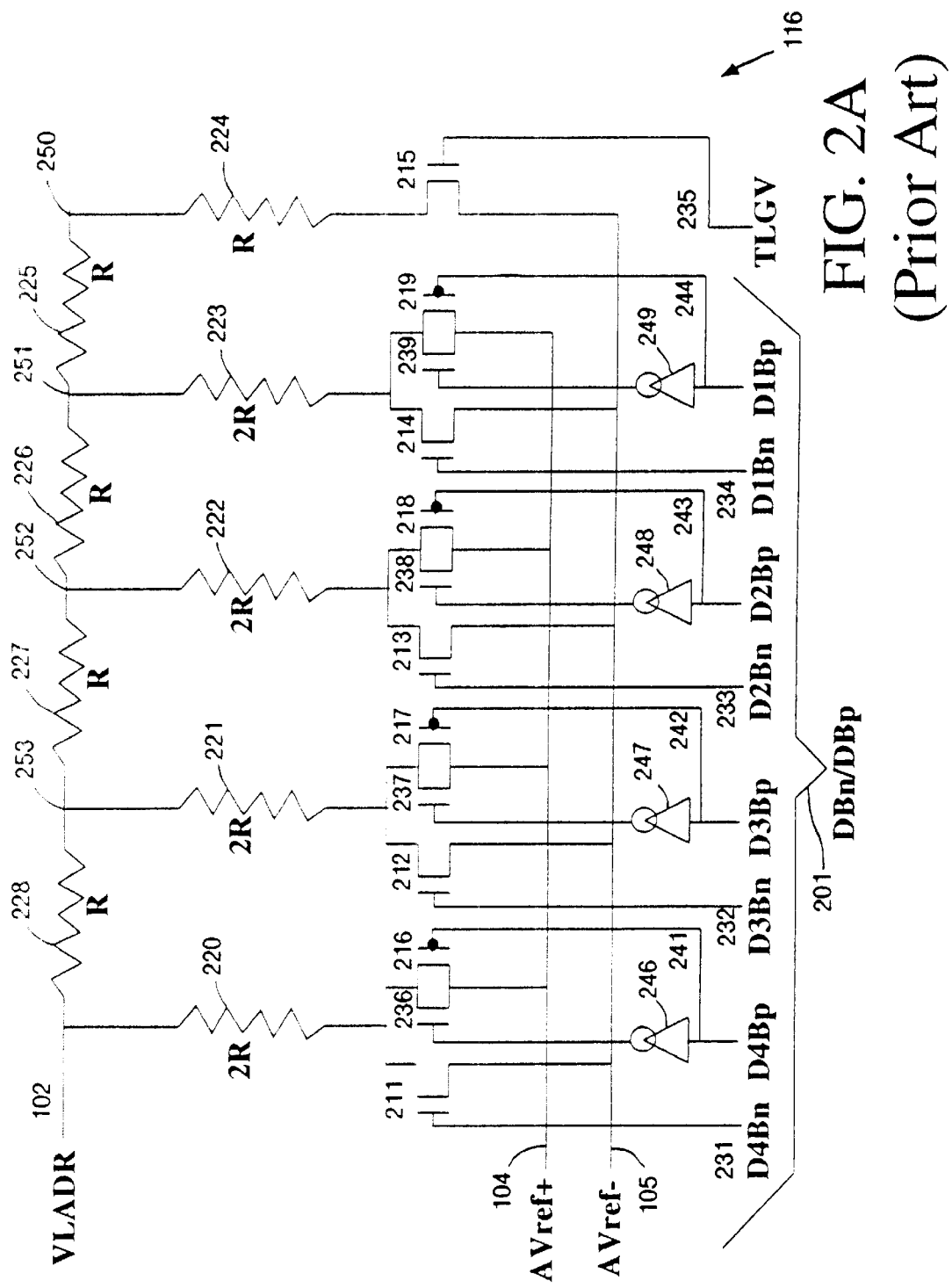
FIG. 2A is a schematic of a prior art 4-bit switched R–2R ladder inverted to provide an analog voltage output.
Figure 3:
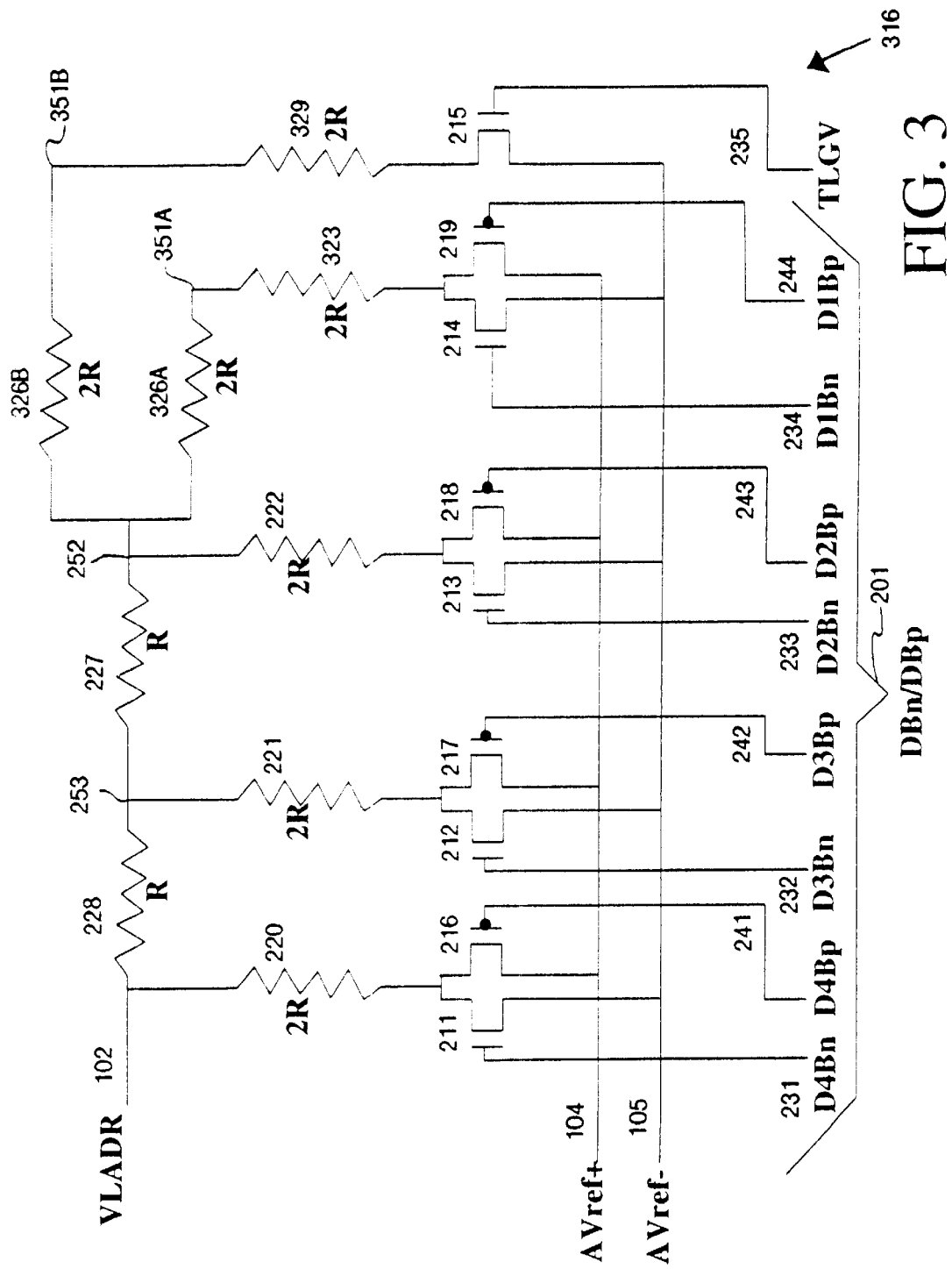
FIG. 3 is a schematic of the present invention in a 4-bit switched R–2R ladder inverted to provide an analog voltage output.

Referring now to FIG. 3, one preferred embodiment of the improved switched R–2R ladder 316 is described. Reference designators in FIG. 3 having the same number as in FIG. 2A denote similar functional elements or nodes. Comparing FIG. 3 with FIG. 2A, switched R–2R ladder 316 has resistors 326A and 326B in place of resistor 226; resistor 323 in place of resistor 223; and resistor 329 in place of resistors 224–225. Essentially, node 251 of FIG. 2A is split into nodes 351A and 351B. Resistor 226 having the unit resistance value of R is split into parallel resistors 326A and 326B each having a resistance value of two units of resistance or 2R. This doubles the series resistance between the LSB and the termination leg. Approximately 50% more voltage is dropped across resistors 326B and 329 in the termination leg such that the drain to source voltage drop VDS across NFET 215 is reduced by approximately 50%. Additionally, FIG. 3 has NFETs 236–239 and inverters 246–249 eliminated when compared with FIG. 2A. NFETs 236–239 are preferably eliminated to avoid transistor breakdown when high voltages are applied to switches of the switched R–2R ladder 416. In many applications, NFETs 236–239 and inverters 246–249 may be still used in lower voltage applications with high current situations, such as in higher order DACs.

The connections of the changed elements to the switched R–2R ladder 316 from the switched R–2R ladder 116 are now described. In the LSB leg, the NFET 214/PFET 219 are coupled in series with resistor 323 and resistor 326A. The drains of the NFET 214/PFET 219 are coupled in series with resistor 323 at its first terminal. Resistor 323 couples to the first terminal of resistor 326A with its second terminal at node 351A. The second terminal of resistor 326A couples to node 252. In the termination leg, the NFET 215 is coupled in series with resistor 329 and resistor 326B. The drain of transistor 215 is coupled to the first terminal of resistor 329. Resistor 329 couples to the first terminal of resistor 326B with its second terminal at node 351B. The second terminal of resistor 326B couples to node 252. Thus, the LSB leg and the termination leg of the switched R–2R ladder 316 are coupled in parallel.

The switched R–2R ladder 316 is a 4 bit inverted R–2R ladder to provide an analog voltage output signal. Alternatively, a non-inverted R–2R ladder could be used to provide an analog current output signal. Signals DBn/DBp 201 are selectively controlled by the switch controller 118 in order to generate an analog voltage output signal VLADR 102. DBn/DBp 201 switches ON and OFF NFETs 211–214 and PFETs 216–219 in order to change the voltage division of the R–2R resistor network between AVref+ 104 and AVref− 105 and VLADR 102. NFET 211 and PFET 216 represent the MSB of the DAC and can couple $8/16$ of the reference voltage range to VLADR 102. NFET 212 and PFET 217 can couple $4/16$ of the reference voltage range to VLADR 102. NFET 213 and PFET 218 can couple $2/16$ of the reference voltage range to VLADR 102. NFET 214 and PFET 219 represent the LSB of the DAC and can couple $1/16$ of the reference voltage range to VLADR 102. The analog voltage level on VLADR 102 represents a summation of the coupling of these fractions of reference voltage range. Thus, when the digital code is 1111, PFETs 216–219 are all ON and NFETs 211–214 are all OFF such that $^{15}/_{16}$ of the reference voltage range is coupled to VLADR 102. When the digital code is 0000, NFETs 211–214 are all ON and PFETs 216–219 are all OFF such that no current flows between AVref+ 104 and AVref– 105 in a resistor and AVref– 105 is coupled to VLADR 102.

The resistance values for the resistors 323, 326A, 326B, and 329 of the improved LSB and termination leg are all two units of resistance or 2R. The resistors of the R–2R ladder may be diffused, pinched, epitaxial or ion implanted semiconductor or thin film type of resistors. Preferably the resistors are a thin film type of tantalum (Ta), cermet (CrSiO), tin oxide (SnO$_2$), nickel chromium (Ni—Cr), or preferably silicon chromium (Si—Cr). The approximate value for a unit of resistance for the preferable resistors is on the order of fourty-two kilo (42K) ohms. While N or P diffusion may be used as material for the resistors, parasitic diodes formed with other semiconductor material cause increased nonlinearity and place limitations on the input reference voltages so diffusion resistors are usually avoided. If necessary, the thin film resistors may be oxidized, annealed or laser trimmed at a factory in order to eliminate user trimming and achieve full scale performance. Alternatively, zener diodes or fusible links may be used for trimming.

The switches of the R–2R ladder are preferably but not limited to PFETs and NFETs of a CMOS or BICMOS process technology that combines CMOS and BJT technologies. The value of RON for all the transistor switches when operating in the linear range is desired to be approximately 1 K ohm. The PFETs are ratioed larger than the NFETs to compensate for mobility differences and then both PFETs and NFETs are binarilly weighted depending upon which leg of the switched R–2R ladder the switches are to be placed.

As previously discussed, linearity of DAC 100 is important to accurately convert DIN 101 to AVout 110. In switching voltages in the switched R–2R ladder 316, PFETs 216–219 and NFETs 211–214 are switched ON to operate in their linear region where drain to source voltage is equivalent to drain to source current times the ON resistance of the transistor. VDS≈IDS×RON. Additionally, PFETs and NFETs are binarilly weighted from LSB to MSB to adjust for differences in IDS drain to source current flow and maintain similar VDS voltage drops across drain to source. For example, if NFET 214/PFET 219 pair is weighted 1×, NFET 213/PFET 218 pair is weighted 2×, NFET 212/PFET 217 pair is weighted 8×, and NFET 211/PFET 216 pair is weighted 16× in transistor size to lower RON of the transistors. This reduces user trimming for a drift that would otherwise be introduced by mismatched RON resistances when the transistor switches are turned ON and OFF.

Figure 2B:
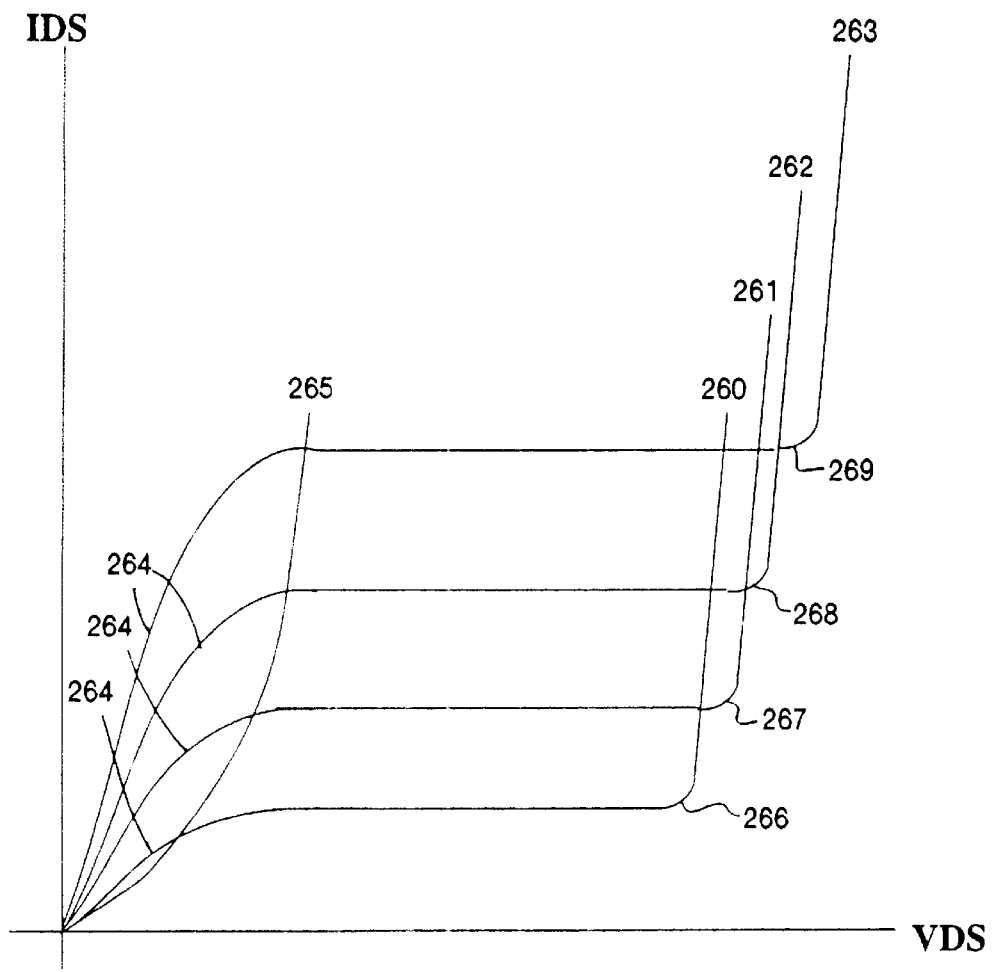
FIG. 2B is a graph of prior art output characteristics for an N-channel MOSFET.

A comparison is now made between the equivalent resistances of the switched R–2R ladder 116 of FIG. 2A and the switched R–2R ladder 316 of FIG. 3. To illustrate that proper voltages are provided onto VLADR 102 by the switched R–2R ladder 316, an equivalent resistance REQ can be calculated at node 252 of FIGS. 2 and 3. REQ is calculated by breaking the circuits at node 252 and assuming NFETs 214 and 215 are ON having no resistance and PFET 219/NFET 239 are OFF such that resistors 223–224, 323, and 329 are shorted to AVref– 105 which is set to ground. Breaking the switched R–2R ladder 116 at node 252 and calculating the equivalent resistance provided by the LSB leg and the termination leg provides a prior art equivalent resistance equation of $$REQpa=r226+[(r223\times(r224+r225))/(r223+r224+r225)].$$

Substituting in the resistance values we find the equation as $$REQpa=R+[(2R\times(R+R))/(2R+R+R)]=2R.$$

Now, breaking the switched R–2R ladder 316 of FIG. 3 at node 252 and calculating the equivalent resistance for the LSB leg and the termination leg provides an equivalent resistance equation for the present invention of $$REQpi=[(r326B+r329)\times(r326A+r323)]/[r326B+r329+r326A+r323].$$

Substituting in the resistance values the equation becomes $$REQpi=[(2R+2R)\times(2R+2R)]/[2R+2R+2R+2R]=2R.$$

Thus, REQpi=REQpa and the circuits of switched R–2R ladder 316 and switched R–2R ladder 116 can provide equivalent conversions.

A comparison is now made between the current flow and voltages in the termination legs of the switched R–2R ladder 116 of FIG. 2A and the switched R–2R ladder 316 of FIG. 3. For purposes of computation assume the digital code DIN is 0001 turning ON PFET 219/NFET 239 such that there is a series path between the LSB leg and the termination leg. In switched R–2R ladder 116 of FIG. 2A, the series path between the reference inputs AVref+ 104 and AVref– 105 consists of PFET 219/NFET 239, resistors 223–225, and NFET 215. In switched R–2R ladder 316 of FIG. 3, the series path between the reference inputs AVref+ 104 and AVref– 105 consists of PFET 219, resistors 323, 326A, 326B, and 329, and NFET 215. Assume that PFET 219/NFET 239 and NFET 215 are operating in their linear regions and assume for the moment that their ON resistance is negligent compared to the resistors value R. Assume AVref– 105 is set to zero and AVref+ 104 is ten volts. Thus, the prior art current equation through the NFET 215 of the switched R–2R ladder 116 in FIG. 2A is $$Ipa=(AVref+)/(r223+r224+r225)=(AVref+)/(2R+R+R)$$

$$Ipa=(AVref+)/(4R)$$

The present invention current equation through the NFET 215 of the switched R–2R ladder 316 in FIG. 3 is $$Ipi=(AVref+)/(r323+r326A+r326B+r329)=(AVref+)/(2R+2R+2R+2R)$$

and $$Ipi=(AVref+)/(8R).$$

Thus, the present invention reduces the current through the NFET 215 by approximately ½ or 50%. Assume that the drain to source voltage of NFET 215 is VDS=IDS×RON. IDS is the current through the termination leg. The prior art NFET 215 VDS voltage drop is $$VDSpa=[(AVref+)\times RON]/(4R).$$

The present invention NFET 215 VDS voltage drop is $$VDSpi=[(AVref+)\times RON]/(8R)$$

Thus, the VDS voltage drop across NFET 215 is reduced by ½ or 50% as well in the switched R–2R ladder 316 in FIG. 3.

Figure 4:
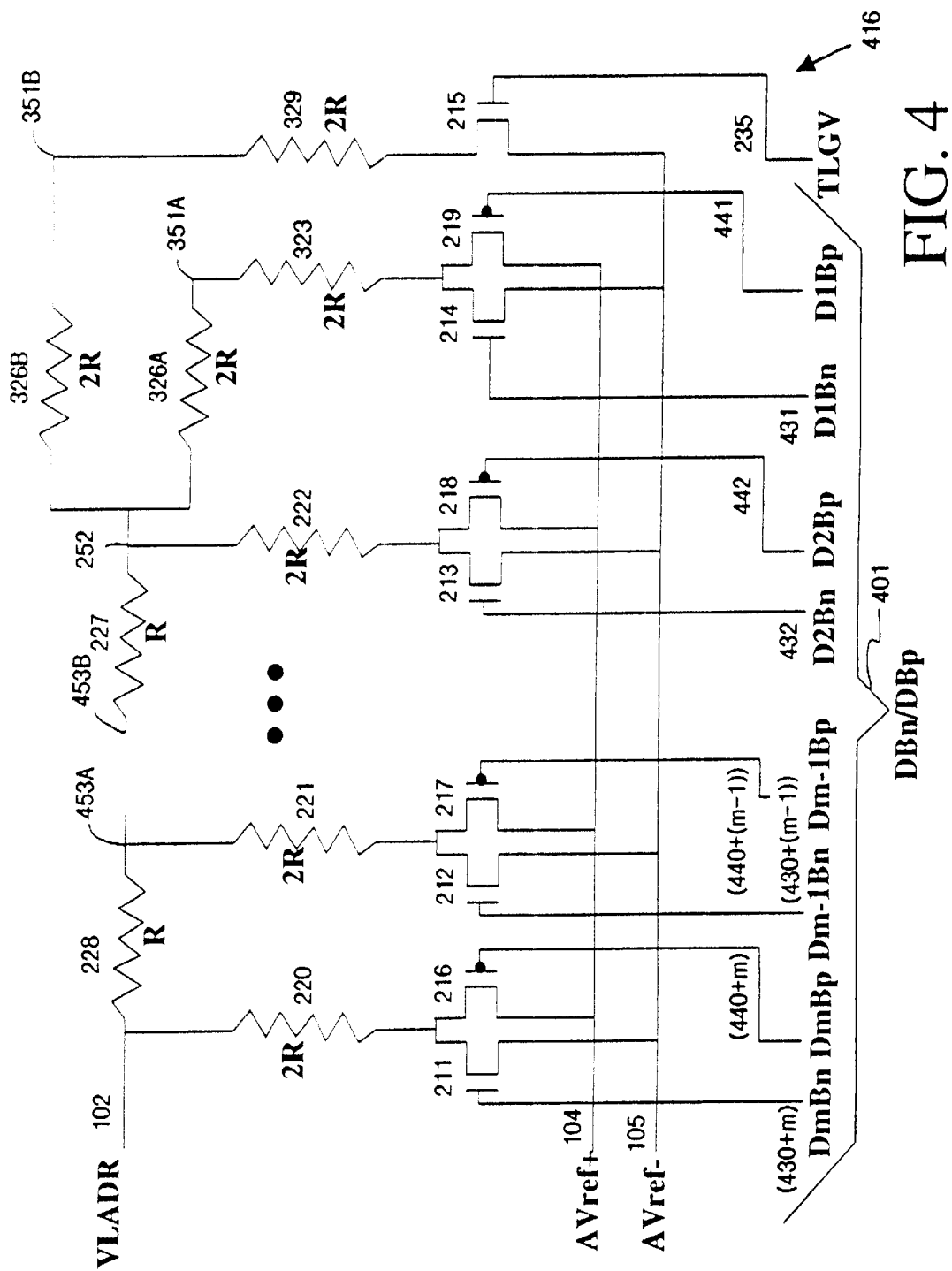
FIG. 4 is a schematic of one embodiment of the present invention in an m-bit switched R–2R ladder inverted to provide an analog voltage output.

Referring now to FIG. 4 another embodiment of the present invention is illustrated. FIG. 4 illustrates how to expand the switched R–2R ladder 316 from 4 bits into m-bits. Essentially, node 253 of FIG. 3 is split into two nodes numbered 453A and 453B in FIG. 4. The desired number of legs, excluding the termination leg are then expanded to total to m. The additional circuitry required to add additional intermediate legs is circuitry similar to the intermediate leg of NFET 213/PFET 208 in series with resistor 222 and resistor 227. Additional signals are added to DBn/DBp 201 including signals D1Bn 431 to DmBn (430+m) and D1Bp 441 to DmBp (440+m). The expansion of the switched R–2R ladder 416 to m-bits generates increased currents through the termination leg over the currents in FIG. 4 and justifies modification of the termination leg to improve linearity.

The switched R–2R ladder 416 is an m-bit inverted R–2R ladder to provide an analog voltage output signal. Alternatively, a non-inverted R–2R ladder could be used to provide an analog current output signal. Signals DBn/DBp 401 are selectively controlled by the switch controller 118 in order to generate an analog voltage output signal VLADR 102. DBn/DBp 401 switches ON and OFF NFETs 211–214 and PFETs 216–219 in each m-bit leg in order to change the voltage division of the R–2R resistor network between AVref+ 104 and AVref– 105 and VLADR 102. NFET 211 and PFET 216 represent the MSB of the DAC and can couple $2^{m-1}/2^m$ of the reference voltage range to VLADR 102. The intermediate bit represented by NFET 212 and PFET 217 can couple $2^{m-2}/2^m$ of the reference voltage range to VLADR 102. The intermediate bit represented by NFET 213 and PFET 218 can couple $2/2^m$ of the reference voltage range to VLADR 102. NFET 214 and PFET 219 represent the LSB of the DAC and can couple $1/2^m$ of the reference voltage range to VLADR 102. The analog voltage level on VLADR 102 represents a summation of the coupling of these fractions of reference voltage range. Thus, when the digital code is 1111, PFETs 216–219 are all ON and NFETs 211–214 are all OFF such that $2^{m-}\ 1/2^m$ of the reference voltage range is coupled to VLADR 102. When the digital code is 0000, NFETs 211–214 are all ON and PFETs 216–219 are all OFF such that no current flows between AVref+ 104 and AVref– 105 in a resistor and AVref– 105 is coupled to VLADR 102.

Figure 5:
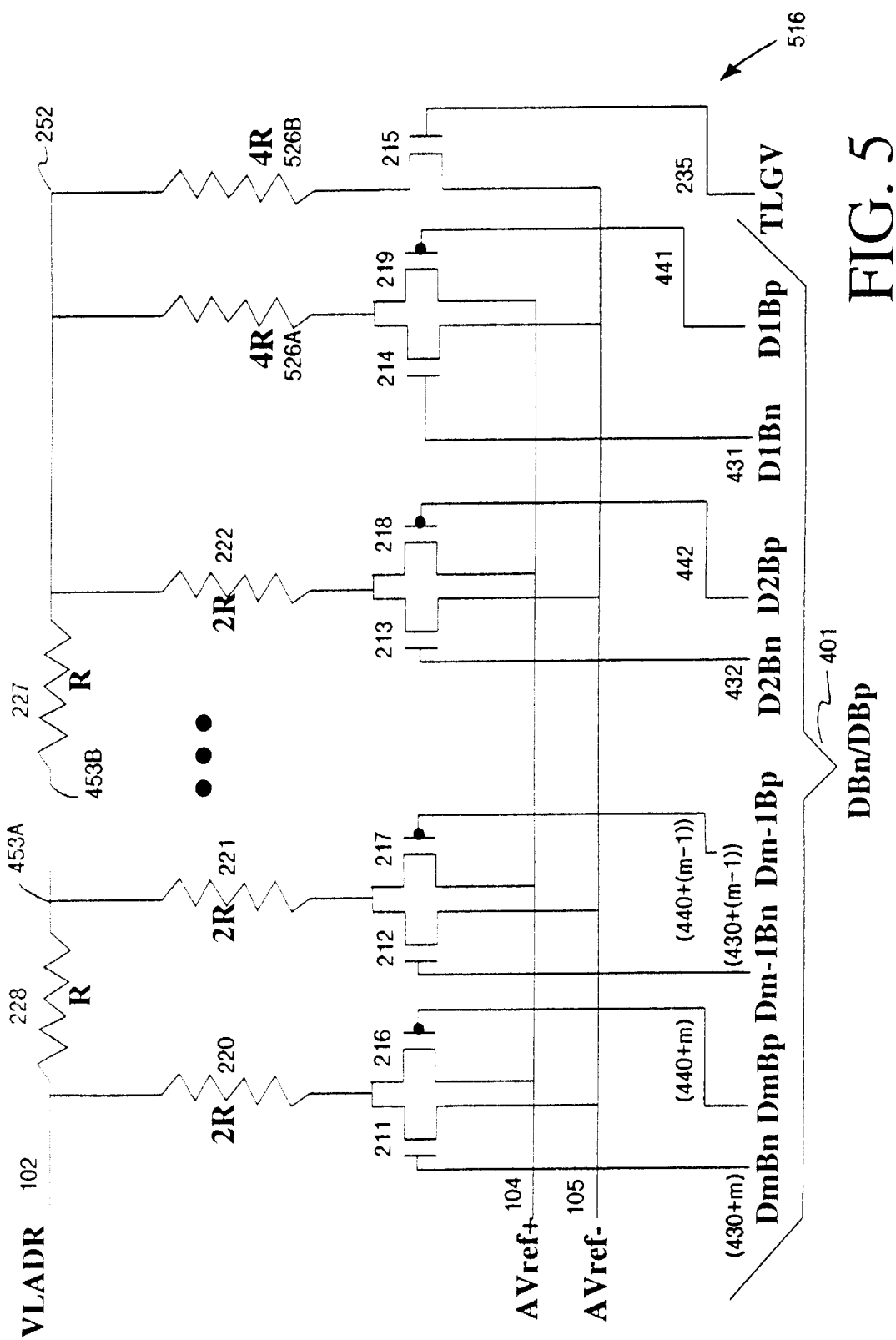
FIG. 5 is a schematic of a second embodiment of the present invention in an m-bit switched R–2R ladder inverted to provide an analog voltage output.

If accommodations can be made in the layout of the resistors of the switched R–2R ladder 316 and 416 of FIGS. 3–4, then resistors 323 and 326A may be lumped together and resistors 329 and 326B may be lumped together. Referring now to FIG. 5, another embodiment of the present invention is illustrated. In FIG. 5, the switched R–2R ladder 516 lumps resistors 323 and 326A together to form resistor 526A. Resistors 329 and resistor 326B are lumped together to form resistor 526B. Thus, the resistance of resistors 526A and 526B is four unit resistors or 4R. Resistor 526A has one end coupled to the drains of NFET 214/PFET 219 and a second end to node 252. Resistor 526B has one end coupled to the drain of NFET 215 and a second end coupled to node 252. Otherwise, like number elements and nodes in FIG. 5 are similar to like number elements and nodes of FIG. 4 and their functionality is equivalent.

The preferred embodiments of the present invention for METHOD AND APPARATUS FOR DIGITAL TO ANALOG CONVERTERS WITH IMPROVED SWITCHED R–2R LADDERS are thus described. While the present invention has been described in particular embodiments, the present invention should not be construed as limited by such embodiments, but rather construed according to the claims that follow below.

What is claimed is:

1. A digital to analog converter (DAC) to convert a digital input signal into an analog output signal, the DAC comprising:
   a switched R–2R ladder including
      a most significant bit (MSB) switching means;
      a least significant bit (LSB) switching means; and
      a termination means in parallel with the LSB switching means, the termination means having a continuously turned ON switch in series with a resistor with increased resistance.

2. The digital to analog converter (DAC) of claim 1, wherein,
   the continuously turned ON switch in series with the resistor is an N channel metal oxide semiconductor field effect transistor (NFET).

3. The digital to analog converter (DAC) of claim 1, wherein,
   the LSB switching means and the MSB switching means include a fully complementary switch having an N channel metal oxide semiconductor field effect transistor (NFET) and a P channel metal oxide semiconductor field effect transistor (PFET).

4. The digital to analog converter (DAC) of claim 1, wherein,
   the resistor in series with the continuously turned ON switch in the termination means has an increased resistance equal to four units of resistance total.

5. The digital to analog converter (DAC) of claim 1, wherein,
   the resistor of the termination means is a thin film resistor made of one of the set of polysilicon, nickel chromium or silicon chromium.

6. The digital to analog converter (DAC) of claim 1 further comprising:
   a switch controller to control the MSB switching means and the LSB switching means.

7. The digital to analog converter (DAC) of claim 6 further comprises:
   a buffer coupled to the switched R–2R ladder.

8. A switched R–2–R ladder comprising:
   a most significant bit (MSB) switching means;
   a termination means in parallel with the LSB switching means, the termination means having a switch continuously closed in series with a resistor with increased resistance.

9. The switched R–2R ladder of claim 8, wherein,
   the MSB switching means and the LSB switching means each include an N channel metal oxide semiconductor field effect (NFET) transistor and a P channel metal oxide semiconductor field effect (PFET) transistor.

10. The switched R–2R ladder of claim 9, wherein,
    the switch of the termination means is an N channel metal oxide semiconductor field effect (NFET) transistor configured to be continuously closed.

11. The switched R–2R ladder of claim 8 wherein,
    the resistor of the termination means is a thin film resistor.

12. The switched R–2R ladder of claim 11 wherein,
    the thin film resistor is made of one of the set of polysilicon, nickel chromium or silicon chromium.

13. The switched m-bit R–2R ladder of claim 8 further comprising:
    a switch controller coupled to the MSB switching means and the LSG switching means, the switch controller to control the MSB switching means and the LSB switching means.

14. A method of converting a digital input signal into an analog output signal, comprising:
    a) providing an R–2R ladder having a termination means, a least significant bit (LSB) switching means, and a most significant bit (MSB) switching means, the termination means in parallel with the LSB switching means, the termination means having a continuously ON switch and a resistor having increased resistance coupled in series, the continuously ON switch and the resistor of the termination means connected in parallel with the LSB switching means to decrease a voltage drop across the continuously ON switch;

b) selectively generating a voltage in the LSB switching means in response to an LSB of the digital input signal;

c) selectively generating a voltage in the MSB switching means in response to an MSB of the digital input signal; and d) summing the selectively generated voltages to generate the analog output signal.

15. The method of claim 14 further comprising:

e) buffering the analog output signal to drive a load.

16. The method of claim 14 further comprising:

e) prior to summing the selectively generated voltages, selectively generating a voltage in an intermediate switching means in response to an intermediate bit of the digital input signal.

17. The method of claim 16 further comprising:

f) repeating step (e) in the intermediate switching means in response to a plurality of intermediate bits of the digital input signal.

* * * * *